(12) United States Patent
Yoshida et al.

(10) Patent No.: US 12,334,387 B2
(45) Date of Patent: Jun. 17, 2025

(54) SUBSTRATE TRANSFER APPARATUS

(71) Applicants: KAWASAKI JUKOGYO KABUSHIKI KAISHA, Kobe (JP); KAWASAKI ROBOTICS (USA), INC., Wixom, MI (US)

(72) Inventors: Masaya Yoshida, Kobe (JP); Yuji Tanaka, San Jose, CA (US); Hajime Nakahara, San Jose, CA (US)

(73) Assignees: KAWASAKI JUKOGYO KABUSHIKI KAISHA, Kobe (JP); KAWASAKI ROBOTICS (USA), INC., Wixom, MI (US)

(*) Notice: Subject to any disclaimer, the term of this patent is extended or adjusted under 35 U.S.C. 154(b) by 841 days.

(21) Appl. No.: 17/623,487

(22) PCT Filed: Feb. 28, 2020

(86) PCT No.: PCT/US2020/020367
§ 371 (c)(1),
(2) Date: Dec. 28, 2021

(87) PCT Pub. No.: WO2020/263357
PCT Pub. Date: Dec. 30, 2020

(65) Prior Publication Data
US 2022/0359261 A1    Nov. 10, 2022

Related U.S. Application Data

(63) Continuation-in-part of application No. 16/456,375, filed on Jun. 28, 2019, now abandoned.

(51) Int. Cl.
*H01L 21/687* (2006.01)
*B25J 15/00* (2006.01)
(Continued)

(52) U.S. Cl.
CPC .... *H01L 21/68707* (2013.01); *B25J 15/0014* (2013.01); *B25J 19/025* (2013.01);
(Continued)

(58) Field of Classification Search
CPC ............ H01L 21/68707; H01L 21/681; H01L 21/67766; H01L 21/67265; B25J 15/0014; B25J 19/025
(Continued)

(56) References Cited

U.S. PATENT DOCUMENTS 7,104,579 B2 * 9/2006 Casarotti ............. H01L 21/6838
294/185
7,547,209 B2 * 6/2009 Asari ....................... B25J 9/163
432/5
(Continued)

FOREIGN PATENT DOCUMENTS

JP    2004-535681 A    11/2004
JP    4575727 B2    11/2010
(Continued)

*Primary Examiner* — Paul T Chin
(74) *Attorney, Agent, or Firm* — Oliff PLC

(57) ABSTRACT

A substrate transfer apparatus includes a base, an arm, an end effector provided at a tip of the arm and having first and second tip portions that are bifurcated, a light emitting unit, a light receiving unit, and a control device controlling an operation of the arm. The control device controls an operation of the arm so that light straightly traveling through a tip of the end effector scans edges of a plurality of substrates accommodated in a front opening unified pod (FOUP), and compares shape patterns of a measured waveform of an output value continuously changed in the light receiving unit with shape patterns of a reference waveform for comparison according to a relative positional relationship between the light and substrate during the operation of the arm and
(Continued)

diagnoses at least one of a state of the substrate, the FOUP, and the end effector based on a comparison result.

11 Claims, 12 Drawing Sheets

(51) Int. Cl.
  *B25J 19/02* (2006.01)
  *H01L 21/67* (2006.01)
  *H01L 21/677* (2006.01)
  *H01L 21/68* (2006.01)

(52) U.S. Cl.
  CPC .. *H01L 21/67265* (2013.01); *H01L 21/67766* (2013.01); *H01L 21/681* (2013.01)

(58) Field of Classification Search
  USPC .......................................................... 294/213
  See application file for complete search history.

(56) References Cited

U.S. PATENT DOCUMENTS

| | | | |
|---|---|---|---|
| 9,455,171 B2* | 9/2016 | Yoshida | B25J 15/0014 |
| 12,077,392 B2* | 9/2024 | Hashima | H01L 21/68707 |
| 12,191,189 B2* | 1/2025 | Kuribayashi | B25J 11/0095 |
| 2003/0035711 A1 | 2/2003 | Gilchrist | |
| 2015/0179491 A1 | 6/2015 | Katsuda et al. | |
| 2016/0111312 A1 | 4/2016 | Yoshida et al. | |
| 2017/0068171 A1 | 3/2017 | Moest et al. | |
| 2018/0161989 A1 | 6/2018 | Bosboom et al. | |
| 2018/0254221 A1 | 9/2018 | Mauer et al. | |

FOREIGN PATENT DOCUMENTS

| | | |
|---|---|---|
| JP | 2011-060924 A | 3/2011 |
| JP | 2015-119070 A | 6/2015 |
| JP | 6088243 B2 | 3/2017 |
| JP | 2018-111200 A | 7/2018 |
| WO | 2017/172324 A1 | 10/2017 |

* cited by examiner

SUBSTRATE TRANSFER APPARATUS

CROSS-REFERENCE TO RELATED APPLICATION

This application claims priority to and the benefit of U.S. patent application Ser. No. 16/456,375, filed on Jun. 28, 2019, the entire disclosure of which is incorporated herein by reference.

BACKGROUND OF INVENTION

Technical Field

The present invention relates to a substrate transfer apparatus.

Background Art

In general, in a semiconductor manufacturing facility or a liquid crystal panel manufacturing facility, a substrate transfer apparatus is used in order to transfer a semiconductor wafer or a glass substrate to a desired position. The substrate transfer apparatus includes a robot arm and an end effector for holding a substrate. For example, in an end effector disclosed in JP 6088243 B2, JP 2004-535681 A and JP 2018-111200 A, the presence or absence of a substrate accommodated in a front-opening unified pod (FOUP) is detected depending on whether or not detection light traveling between the pair of bifurcated tip portions is shielded by the substrate.

However, the substrate transfer apparatus including the end effector according to the related art described above detects the presence or absence of the substrate by converting an output value (for example, an output voltage) continuously changed depending on an amount of received light in a light receiving unit into a binary signal. For this reason, it has been impossible to accurately diagnose a state of the substrate (for example, a state where a surface of the substrate is inclined, or the like).

SUMMARY OF INVENTION

The present invention has been made to solve the problem as described above, and an object of the present invention is to accurately diagnose a state of a substrate accommodated in a front opening unified pod (FOUP) in a substrate transfer apparatus.

In order to achieve the above object, a substrate transfer apparatus according to an embodiment of the present invention includes: a base; a robot arm mounted on the base; an end effector provided at a tip of the robot arm and having a first tip portion and a second tip portion that are bifurcated; a light emitting unit configured to emit light from the first tip portion toward the second tip portion; a light receiving unit configured to convert detection light into an output value continuously changed depending on an amount of received light traveling through a space between the first tip portion and the second tip portion and incident on the second tip portion; and a control device controlling an operation of the robot arm, in which the control device controls an operation of the robot arm so that light traveling through a tip of the end effector scans edges of a plurality of substrates accommodated in a front opening unified pod (FOUP), and compares shape patterns of a measured waveform of the output value continuously changed in the light receiving unit with shape patterns of a reference waveform for comparison according to a relative positional relationship between the light and the substrate during the operation of the robot arm and diagnoses at least one of a state of the substrate, a state of the FOUP, and a state of the end effector based on a comparison result.

The control device may compare a shape pattern in one section with a shape pattern in another section of the measured waveform, and determine that a surface of the substrate is inclined in the one section in a case where the shape pattern in the one section does not coincide with the shape pattern in the other section.

In addition, the control device may compare shape patterns of a measured waveform measured this time with shape patterns of a measured waveform for comparison measured last time, and determine that a surface of the substrate is inclined in one section of the measured waveform measured this time in a case where a shape pattern in the one section of the measured waveform measured this time does not coincide with a shape pattern in one section of the measured waveform for comparison measured last time.

Further, the control device may compare the shape patterns of the measured waveform measured this time with the shape patterns of the measured waveform for comparison measured last time, and determine that the FOUP is inclined in a case where shape patterns in all sections of the measured waveform do not coincide with shape patterns in all sections of the measured waveform for comparison.

In addition, a plurality of the FOUPs may be arranged at different positions, and the control device may compare shape patterns of a measured waveform measured in one FOUP with shape patterns of a measured waveform for comparison measured in the other FOUPs, and determine that the one FOUP is inclined in a case where shape patterns in all sections of the measured waveform measured in the one FOUP do not coincide with shape patterns in all sections of the measured waveform for comparison measured in the other FOUPs.

Further, the control device may compare the shape patterns of the measured waveform measured this time with the shape patterns of the measured waveform for comparison measured last time in a state where an inclination of the FOUP is corrected, and determine that the end effector is inclined in a case where shape patterns in all sections of the measured waveform measured this time do not coincide with shape patterns in all sections of the measured waveform for comparison measured last time.

In addition, the control device may compare the shape patterns of the measured waveform measured this time with the shape patterns of the measured waveform for comparison measured last time, and determine that at least one of intensity of light of the light emitting unit and light receiving sensitivity of the light receiving unit decreases in a case where output values in all the sections of the measured waveform measured this time are lower than output values in all the sections of the measured waveform for comparison measured last time.

In addition, the substrate transfer apparatus may further include a display device displaying a diagnosis result.

A substrate transfer apparatus according to another embodiment of the present invention includes: a base; a robot arm mounted on the base; an end effector provided at a tip of the robot arm and having a first tip portion and a second tip portion that are bifurcated; a light emitting unit configured to emit light from the first tip portion toward the second tip portion; a light receiving unit configured to convert detection light into an output value continuously changed depending on an amount of received light traveling through a space between the first tip portion and the second tip portion and incident on the second tip portion; and a control device controlling an operation of the robot arm, in which the control device controls the operation of the robot arm so that light traveling through a tip of the end effector scans a target in a horizontal direction with respect to the target and measures a position of the target in the horizontal direction based on a measured waveform of the output value continuously changed in the light receiving unit according to a relative positional relationship between the light and the target during the operation of the robot arm.

The position of the target may be a position of a center or a position of an edge of the target in a horizontal direction. The target may be a substrate accommodated in an FOUP and having a disk shape.

The present invention has the configuration described above, and can accurately diagnose a state of a substrate accommodated in an FOUP in a substrate transfer apparatus.

DESCRIPTION OF EMBODIMENTS

Hereinafter, preferred embodiments of the present invention will be described with reference to the drawings. In the following description, the same or corresponding components will be denoted by the same reference symbols throughout the drawings, and an overlapping description thereof will be omitted. In addition, the drawings schematically show the respective components for easy understanding.

First Embodiment

Figure 1:
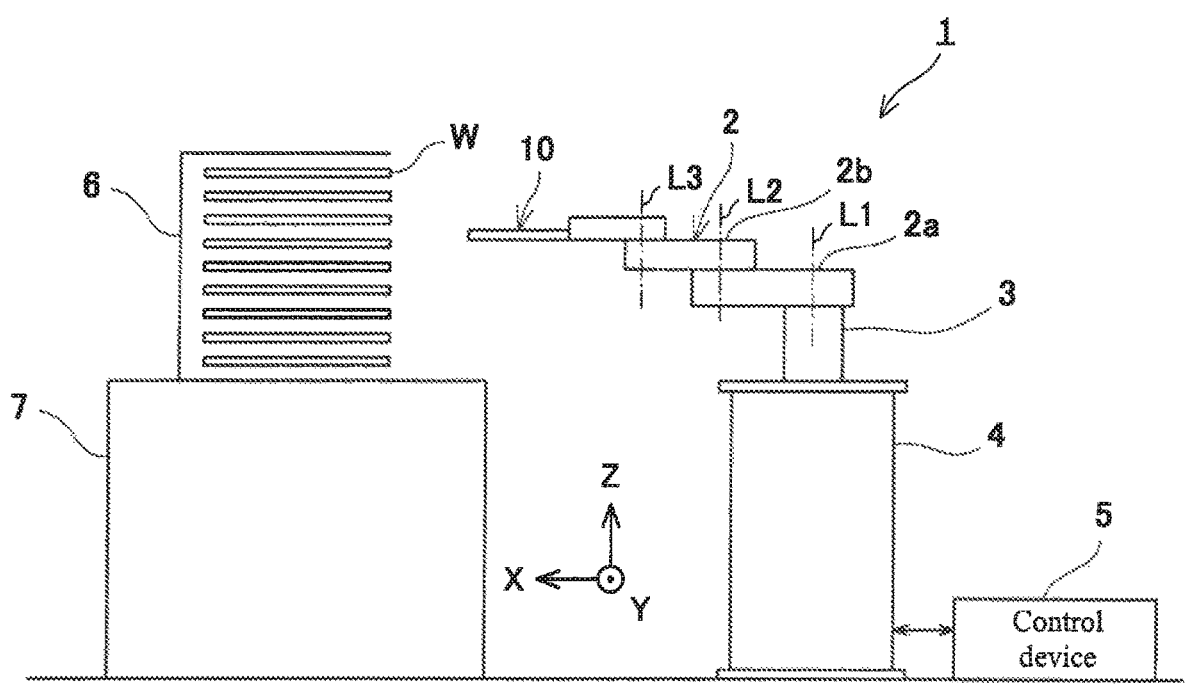
FIG. 1 is a side view showing a substrate transfer apparatus according to a first embodiment of the present invention.

FIG. 1 is a side view showing a substrate transfer apparatus 1 according to a first embodiment of the present invention. As shown in FIG. 1, the substrate transfer apparatus 1 is used in a semiconductor processing facility, which is a facility for processing a semiconductor wafer. Examples of the semiconductor wafer include a silicon wafer, a sapphire (single crystal alumina) wafer, and other various wafers. In addition, examples of a glass wafer include a glass substrate for a flat panel display (FPD) and a glass substrate for a micro electro mechanical systems (MEMS).

A semiconductor wafer (hereinafter also simply referred to as a substrate) W before and after being processed is accommodated in a container called a front opening unified pod (FOUP) 6. The FOUP 6 relates to a local cleaning technology, and is a substrate container for mini-environment in a clean environment. A plurality of substrates W are accommodated in the FOUP 6. Each substrate W is accommodated in each slot (not shown) of the FOUP 6. The respective substrates W are arranged at equal intervals in a vertical direction Z in a horizontal state. The FOUP 6 is formed in a substantially box shape on a base 7 and is opened to one side. The semiconductor processing facility includes a substrate processing apparatus (not shown) that processes the substrate W. Examples of processing for the substrate W include process processing such as thermal processing, impurity introduction processing, thin film formation processing, lithography processing, cleaning processing, planarization processing, and the like. The substrate W is transferred between the FOUP 6 and the substrate processing apparatus (not shown) by the substrate transfer apparatus 1.

In the present embodiment, the substrate transfer apparatus 1 is a so-called horizontal four-axis articulated robot. The substrate transfer apparatus 1 is provided with a wrist having a degree of freedom in a horizontal direction at a tip portion of a robot arm (hereinafter also simply referred to as an "arm") 2 having a degree of freedom in three axis directions of X, Y, and Z axes, and is provided with an end effector 10 holding the substrate W at the wrist.

The substrate transfer apparatus 1 has a base 4 fixed to an appropriate place (for example, a floor) of the semiconductor processing facility, and the base 4 is provided with an elevating shaft 3. In the base 4, an axis of the elevating shaft 3 is directed, for example, vertically. An actuator (not shown) formed of, for example, an air cylinder is incorporated in the base 4. By an operation of this actuator, the elevating shaft 3 ascends and descends in the vertical direction on an upper surface side of the base 4.

The arm 2 includes a first arm 2a and a second arm 2b. The first arm 2a is provided at an upper end portion of the elevating shaft 3. The first arm 2a extends horizontally from the upper end portion of the elevating shaft 3. One end portion of the first arm 2a is connected to the elevating shaft 3 so as to be swingable around a vertical axis L1, and an actuator (not shown) formed of, for example, an electric motor is incorporated in the elevating shaft 3. By an operation of this actuator, the first arm 2a swings in a horizontal plane with respect to the elevating shaft 3.

The second arm 2b is provided on an upper surface side of the other end portion of the first arm 2a. The second arm 2b extends horizontally from the other end portion of the first arm 2a. One end portion of the second arm 2b is connected to the first arm 2a so as to be swingable around a vertical axis L2. An actuator (not shown) formed of, for example, an electric motor is incorporated in the other end portion of the first arm 2a. By an operation of this actuator, the second arm 2b swings in a horizontal plane with respect to the other end portion of the first arm 2a.

The end effector 10 holding the substrate W is provided on an upper surface side of the other end portion of the second arm 2b. The end effector 10 is connected to the other end portion of the second arm 2b so as to be swingable around a vertical axis L3. An actuator (not shown) formed of, for example, an electric motor is incorporated in the other end portion of the second arm 2b. By an operation of this actuator, the end effector 10 swings in a horizontal plane with respect to the other end portion of the second arm 2b.

A control device 5 controls operations of each actuator driving the elevating shaft 3, the first arm 2a, the second arm 2b, and the end effector 10, for example, by an input from an operation device (not shown) or automatically, so that the end effector 10 moves vertically and horizontally. The end effector 10 can move along an arbitrary path in the horizontal plane by appropriately controlling operation speeds of the actuators.

Figure 2:
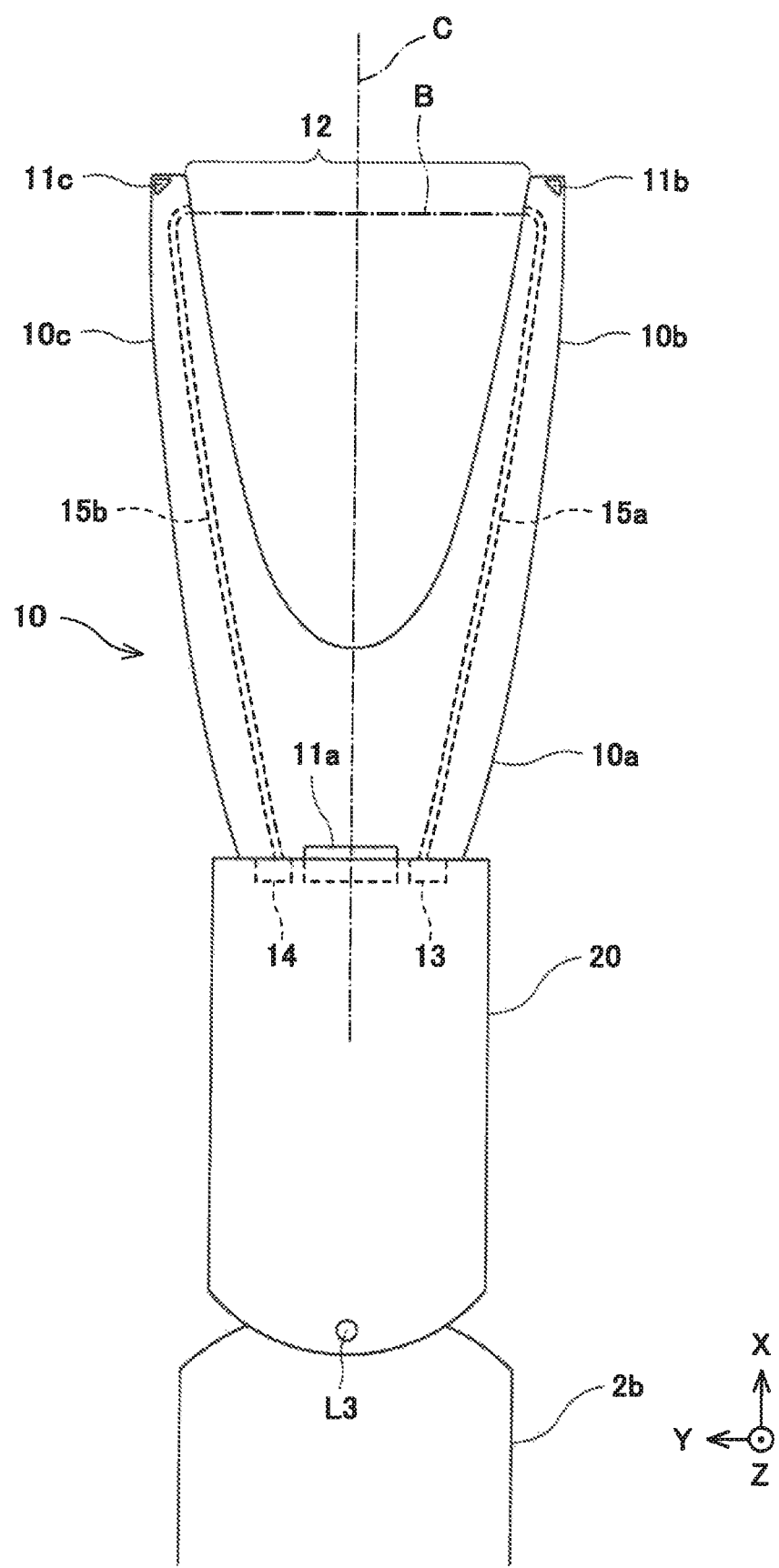
FIG. 2 is a plan view showing a configuration of an end effector of FIG. 1.

FIG. 2 is a plan view of the end effector 10 when viewed from above. As shown in FIG. 2, the end effector 10 is formed of a plate material formed in a U shape in plan view. In the present embodiment, the plate material is bilaterally symmetrical with respect to a center line C. The end effector 10 has a single base end portion 10a, and a first tip portion 10b and a second tip portion 10c that are bifurcated from the base end portion 10a. A space is formed between the first tip portion 10b and the second tip portion 10c. The base end portion 10a of the end effector 10 is fixed to one end of a mounting plate 20, and the end effector 10 extends horizontally from the mounting plate 20. The other end of the mounting plate 20 is connected to the other end portion of the second arm 2b so as to be swingable around the vertical axis L3.

The end effector 10 is configured to be able to hold a substrate W having a disk shape. In the present embodiment, the end effector 10 includes a pressing surface 11a provided on an upper surface of the base end portion 10a and two edge grips 11b and 11c provided, respectively, on upper surfaces of the first tip portion 10b and the second tip portion 10c. An edge on one end side of the substrate W placed on the end effector 10 is locked by the two edge grips 11b and 11c, and an edge on the other end side of the substrate W is pressed by the pressing surface 11a, so that the substrate W is fixed on the end effector 10.

A light emitting unit 13 is incorporated in the mounting plate 20 of the end effector 10. The light emitting unit 13 converts an electrical input from the control device 5 to generate detection light. One end of an optical fiber 15a is connected to the light emitting unit 13, and the optical fiber 15a is laid from a back side of the base end portion 10a of the end effector 10 to a back side of the first tip portion 10b. The optical fiber 15a guides the detection light emitted from the light emitting unit 13 to the back side of the first tip portion 10b of the end effector 10. A light receiving unit 14 is incorporated in the mounting plate 20 of the end effector 10. The light receiving unit 14 receives the detection light and converts the detection light into an electrical output to the control device 5. One end of an optical fiber 15b is connected to a back side of the second tip portion 10c of the end effector 10, and the optical fiber 15b is laid to the light receiving unit 14 incorporated in the mounting plate 20 of the end effector 10. The optical fiber 15b guides detection light that enters the back side of the second tip portion 10c of the end effector 10, to the light receiving unit 14. Note that light converging elements (for example, convex lenses) and light diverging elements (for example, concave lenses) (not shown) may be appropriately arranged at both ends of each of the optical fibers 15a and 15b, if necessary.

Figure 3:
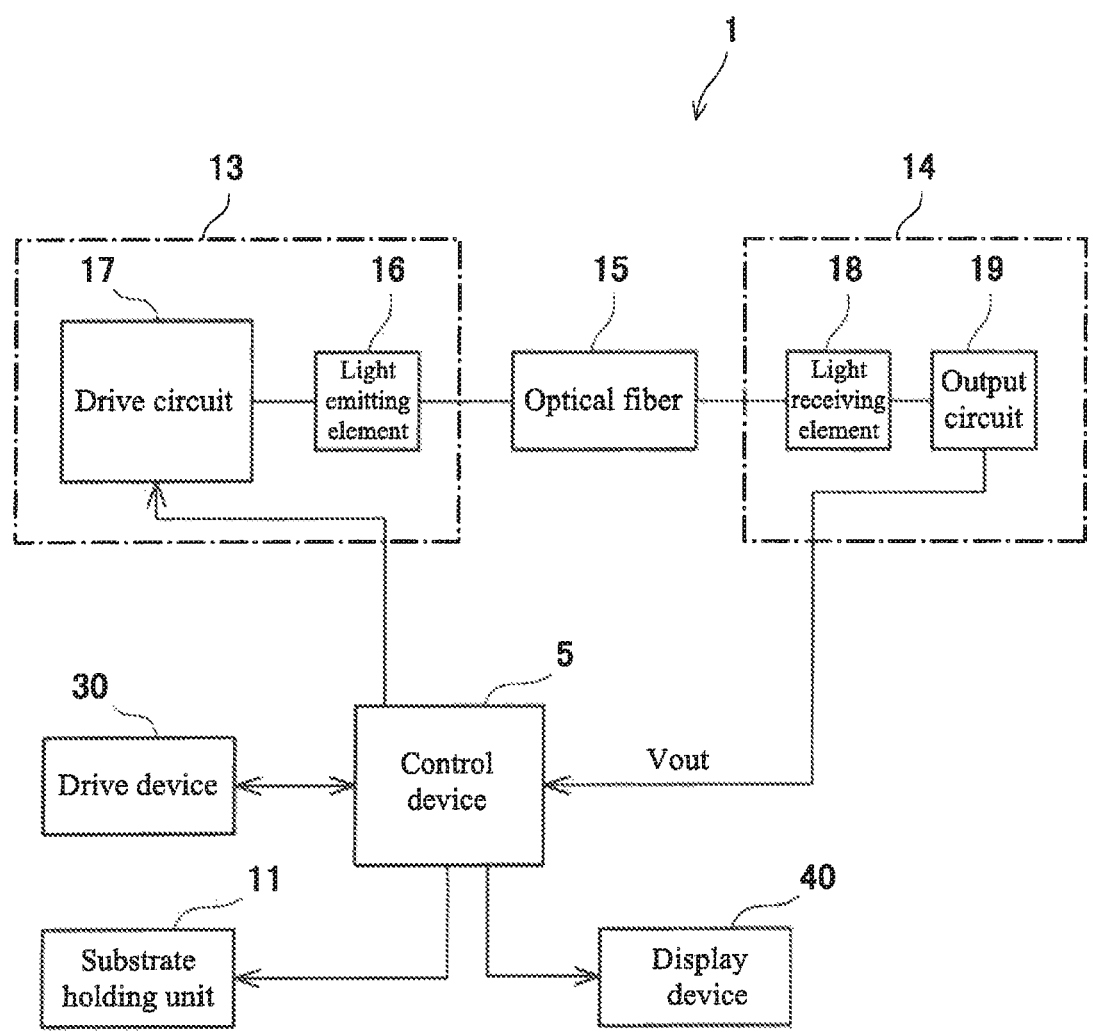
FIG. 3 is a block diagram showing an outline of a configuration of the substrate transfer apparatus of FIG. 1.

FIG. 3 is a block diagram showing an outline of a configuration of the substrate transfer apparatus 1. As shown in FIG. 3, the control device 5 is connected to the light emitting unit 13, the light receiving unit 14, and a substrate holding unit 11 of the end effector 10 and a drive device 30 of the substrate transfer apparatus 1 through control lines, and is, for example, a robot controller including a computer such as a microcontroller. The control device 5 is not limited to a single device, and may include a plurality of devices.

The light emitting unit 13 includes a light emitting element 16 and a drive circuit 17. The light emitting element 16 generates and emits detection light. For example, a light emitting diode or a laser diode is used as the light emitting element 16. The drive circuit 17 applies a voltage to the light emitting element 16 to drive the light emitting element. The drive circuit 17 generates a voltage depending on a control signal (electrical input) from the control device 5 and drives the light emitting element 16.

The light receiving unit 14 includes a light receiving element 18 and an output circuit 19. The light receiving element 18 receives the detection light and converts the detection light into an output value continuously changed depending on an amount of received light. In the present embodiment, the light receiving element 18 receives the detection light and converts the detection light into an output voltage continuously changed depending on the amount of received light. For example, a photodiode is used as the light receiving element 18. The output circuit 19 amplifies an output voltage $V_{out}$ and outputs the amplified output voltage $V_{out}$ to the control device 5.

The light emitting element 16 and the optical fiber 15a are connected to each other by a connector (not shown). Similarly, the light receiving element 18 and the optical fiber 15b are also connected to each other by a connector (not shown). As described above, in the present embodiment, the light emitting unit 13 and the light receiving unit 14 include the light emitting element 16 and the light receiving element 18, respectively, and the light emitting element 16 and the light receiving element 18 constitute a transmission type optical sensor.

The substrate holding unit 11 includes the pressing surface 11a and the two edge grips 11b and 11c shown in FIG. 2. In the substrate holding unit 11, a pressure of the pressing surface 11a in contact with the substrate W is controlled according to a control command of the control device 5. The edge on one end side of the substrate W placed on the end effector 10 is locked by the two edge grips 11b and 11c, and the edge on the other end side of the substrate W is pressed by the pressing surface 11a, so that the substrate W is held by the end effector 10.

The drive device 30 is configured by an actuator that drives the elevating shaft 3, the first arm 2a, and the second arm 2b shown in FIG. 1. The drive device 30 vertically and horizontally moves the end effector 10 by operating the actuator that drives the elevating shaft 3, the first arm 2a, and the second arm 2b according to a control command of the control device 5.

The control device 5 includes an arithmetic unit, a storage unit, and a servo control unit (not shown). The storage unit stores information such as a basic program of the control device 5 and an operation program of a robot and data of measured waveforms or reference waveforms. The arithmetic unit performs arithmetic processing for robot control and generates a control command for the robot. The servo control unit is configured to control an operation of the drive device 30 and the substrate holding unit 11 based on the control command generated by the arithmetic unit. In the present embodiment, the control device 5 performs arithmetic processing for diagnosing a state of the substrate W, a state of the FOUP 6 or the like based on data such as a measured waveform or a reference waveform of the output voltage $V_{out}$ of the light receiving unit 14, in the arithmetic unit, and outputs an arithmetic result to a display device 40. The display device 40 is a monitor for displaying a diagnosis result.

Figure 4A:
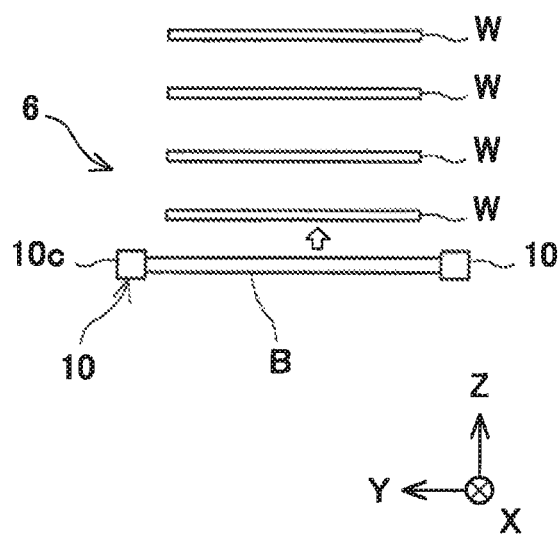
FIGS. 4(a) and 4(b) are schematic views for describing an operation of the end effector.
Figure 4B:
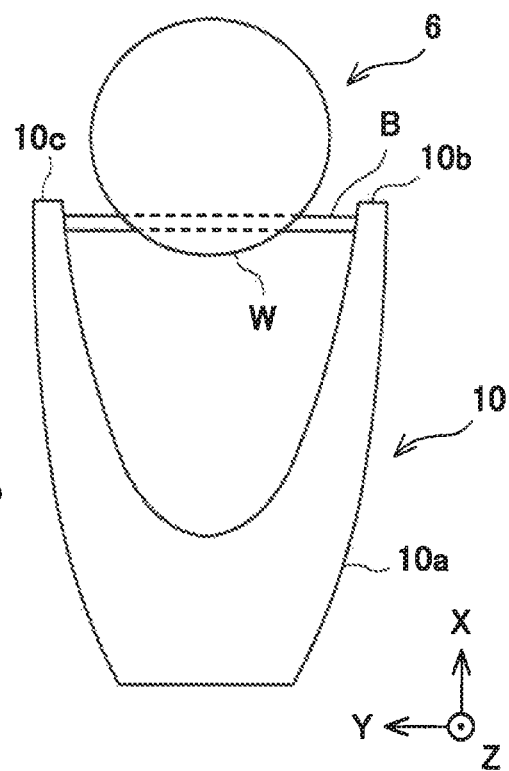
Figure 5A:
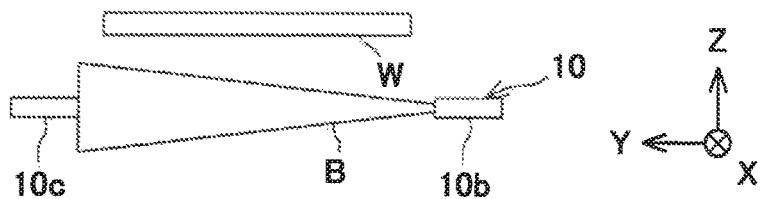
FIGS. 5(a) to 5(g) are schematic views for describing a change in an amount of received light at the time of the operation of the end effector.
Figure 5B:
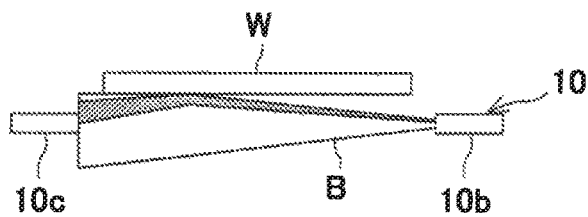
Figure 5C:
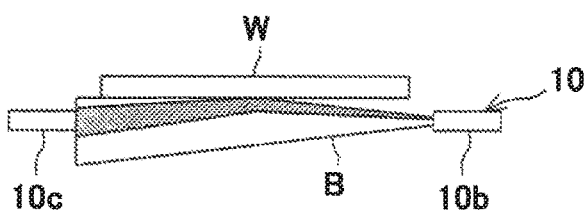
Figure 5D:
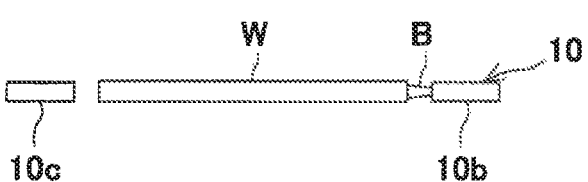
Figure 5E:
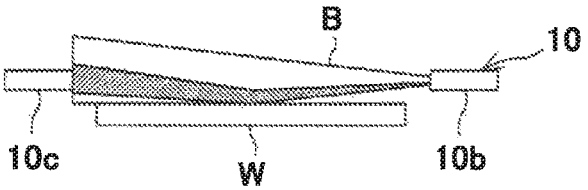
Figure 5F:
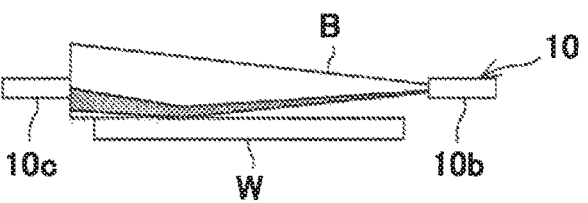
Figure 5G:
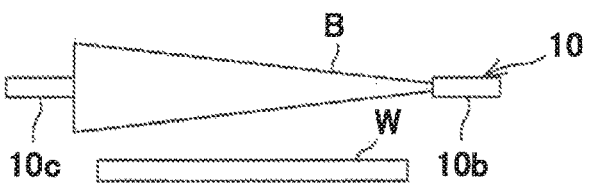

Next, an operation of the end effector 10 will be described. FIGS. 4(*a*) and 4(*b*) are schematic views for describing an operation of the end effector. Here, for simplification, only the end effector 10 and the substrates W are shown, and four substrates W are accommodated in the slots of the FOUP 6. As shown in FIGS. 4(*a*) and 4(*b*), the control device 5 controls an operation of the arm 2 to cause a tip of the end effector 10 to sequentially face and scan each substrate W from the bottom slot of the FOUP 6 to the top slot. FIGS. 5(*a*) to 5(*g*) schematically show light B changed according to a relative positional relationship between the substrate W and the light B at the time of operating the end effector 10 in the bottom slot of the FOUP 6. Since photons (not shown) of the light B travel while being scattered in the air, a shape of the light B is enlarged from the first tip portion 10*b* toward the second tip portion 10*c* in FIGS. 5(*a*) to 5(*g*).

First, as shown in FIG. 5(*a*), the light B emitted from the first tip portion 10*b* of the end effector 10 travels in a thickness direction of the substrate W (a positive direction of a Y axis in FIGS. 5(*a*) to 5(*g*)). The light B travels through a space between the first tip portion 10*b* and the second tip portion 10*c*, and is received by the second tip portion 10*c* of the end effector 10. In this section, an amount of received light incident on the second tip portion 10*c* is constant.

In the next moment, as shown in FIG. 5(*b*), photons in an upper side portion of the light B are reflected by a lower surface of the substrate W, and the reflected light is received by the second tip portion 10*c* of the end effector 10 together with straightly traveling light. In FIG. 5(*b*), light reflected by the lower surface of the substrate W and received by the second tip portion 10*c* out of the light B is indicated by hatching. As described above, since the light from the first tip portion 10*b* and the reflected light from the substrate W enter the second tip portion 10*c*, an amount of received light incident on the second tip portion 10*c* increases in this section.

In the next moment, as shown in FIG. 5(*c*), a ratio of the reflected light (a portion indicated by hatching in FIG. 5(*c*)) of the light B reflected by the lower surface of the substrate W increases. As a result, in this section, an amount of received light incident on the second tip portion 10*c* further increases.

In the next moment, as shown in FIG. 5(*d*), the light B emitted from the first tip portion 10*b* of the end effector 10 enters in the thickness direction of the substrate W, and the incident light B is blocked by the substrate W. Almost all of the incident light B in the thickness direction of the substrate W is reflected or absorbed by a surface parallel to the thickness direction of the substrate W, so that the light B is not received by the second tip portion 10*c* of the end effector 10. In this section, an amount of received light incident on the second tip portion 10*c* decreases.

In the next moment, as shown in FIG. 5(*e*), a part of the light B emitted from the first tip portion 10*b* of the end effector 10 travels through a space between the first tip portion 10*b* and the second tip portion 10*c*, and is received by the second tip portion 10*c* of the end effector 10. Photons of a lower side portion of the light B are reflected by an upper surface of the substrate W, and the reflected light is received by the second tip portion 10*c* of the end effector 10 together with straightly traveling light. In FIG. 5(*e*), light reflected by the upper surface of the substrate W and received by the second tip portion 10*c* out of the light B is indicated by hatching. As described above, since the light from the first tip portion 10*b* and the reflected light from the substrate W enter the second tip portion 10*c*, an amount of received light incident on the second tip portion 10*c* increases in this section.

In the next moment, as shown in FIG. 5(*f*), a ratio of the reflected light (a portion indicated by hatching in FIG. 5(*f*)) reflected by the upper surface of the substrate W to the light B decreases. As a result, in this section, an amount of received light incident on the second tip portion 10*c* further decreases.

Then, as shown in FIG. 5(*g*), the light B emitted from the first tip portion 10*b* of the end effector 10 straightly travels through a space between the first tip portion 10*b* and the second tip portion 10*c*, and all of the emitted light B is received by the second tip portion 10*c* of the end effector 10. In this section, an amount of received light incident on the second tip portion 10*c* is constant.

Figure 6:
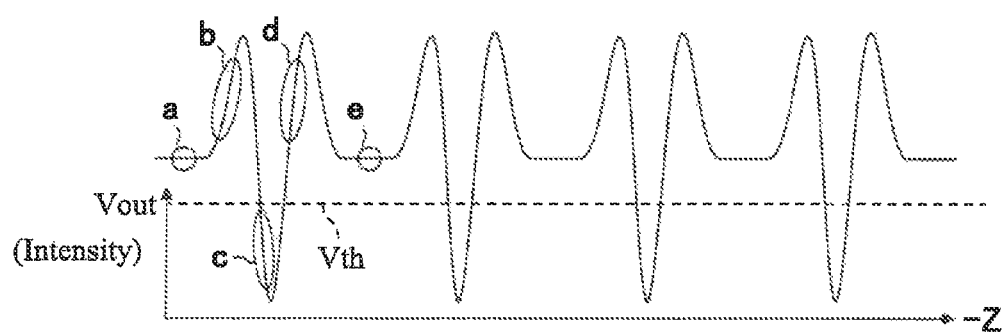
FIG. 6 is a graph showing an example of an output waveform at the time of the operation of the end effector.
Figure 6:
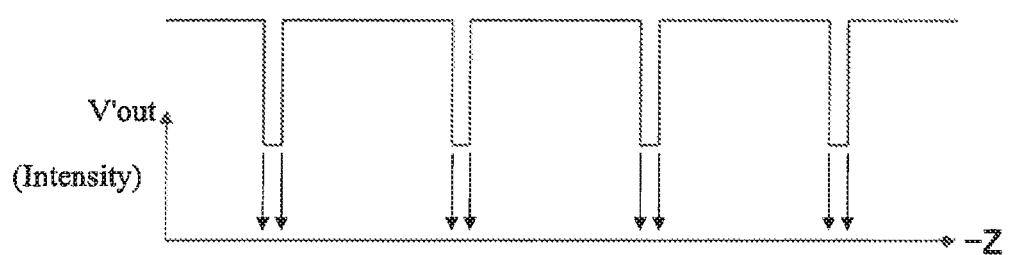

FIG. 6 is a graph showing an example of an output waveform at the time of the operation of the end effector 10. A horizontal axis indicates a negative direction of Z, and a vertical axis indicates the output voltage $V_{out}$ of the light receiving unit 14. Here, the output voltage $V_{out}$ is a value depending on an amount of received light (intensity of light). A waveform of an upper side of FIG. 6 has four shape patterns corresponding to the four substrates W accommodated in the FOUP 6. One shape pattern corresponds to the operation of the end effector 10 shown in FIG. 5. In a section a, the output voltage $V_{out}$ of the light receiving unit 14 is a constant value (corresponds to FIG. 5(*a*)). In a section b, the output voltage $V_{out}$ of the light receiving unit 14 increases (corresponds to FIGS. 5(*b*) and 5(*c*)). In a section c, the output voltage $V_{out}$ of the light receiving unit 14 decreases (corresponds to FIG. 5(*d*)). In a section d, the output voltage $V_{out}$ of the light receiving unit 14 increases (corresponds to FIGS. 5(*e*) and 5(*f*)). In a section e, the output voltage $V_{out}$ of the light receiving unit 14 is a constant value (corresponds to FIG. 5(*g*)). As described above, when an edge of the substrate W accommodated in the FOUP 6 is scanned by the light B straightly traveling through the tip of the end effector 10, the output voltage $V_{out}$ of the light receiving unit 14 is continuously changed according to the relative positional relationship between the light B and the substrate W.

Conventionally, as shown in a waveform of a lower side of FIG. 6, a threshold value $V_{th}$ has been set to convert the output voltage $V_{out}$ of the light receiving unit 14 into a binary signal $V'_{out}$, and the presence or absence of the substrate W has been detected depending on whether or not the light B of the end effector 10 is shielded by the substrate W. In a case where the substrate W is not accommodated in the slot, the light B travels through the space between the first tip portion 10*b* and the second tip portion 10*c*. Thus, the light B is received by an end portion of the optical fiber 15*b* on the back side of the second tip portion 10*c* of the end effector 10. Since the output voltage $V_{out}$ depending on the amount of received light is higher than the threshold value $V_{th}$, the light receiving unit 14 outputs a high level signal $V'_{out}$ to the control device 5. On the other hand, in a case where the substrate W is accommodated in the slot, the light B traveling through the space between the first tip portion 10*b* and the second tip portion 10*c* of the end effector 10 is blocked by the edge of the substrate W. In this case, since the detection light B is not received by the end portion of the optical fiber 15*b* on the back side of the second tip portion 10*c* of the end effector 10, the output voltage $V_{out}$ depending on the amount of received light is lower than the threshold value $V_{th}$, and the light receiving unit 14 thus outputs a low level signal $V'_{out}$ to the control device 5. In this way, the control device 5 sequentially determines whether or not the substrates are accommodated in each slot in the FOUP 6. However, in such a conventional method, for example, a state in which a surface of the substrate W is inclined, or the like, cannot be diagnosed.

Therefore, according to the present embodiment, the control device 5 compares the shape patterns of the measured waveform of the output value ($V_{out}$) continuously changed depending on the amount of received light with shape patterns of a reference waveform for comparison according to the relative positional relationship between the light B and the substrate W, and diagnoses the state of the substrate W and the state of the FOUP 6 based on a comparison result.

<Diagnosis of State of Substrate>

Figure 7:
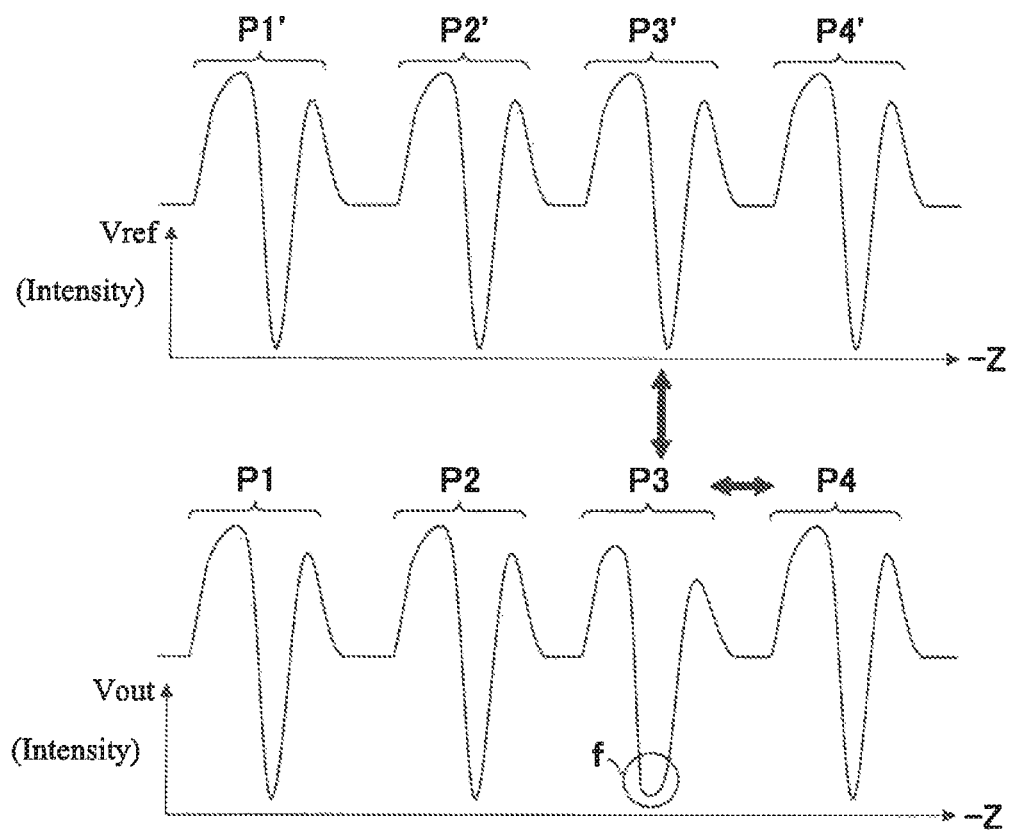
FIG. 7 is a graph showing an example of an output waveform at the time of the operation of the end effector.

The diagnosis of the state of the substrate W is performed, for example, at the time of performing a transfer operation of the substrate W. FIG. 7 is a graph showing an example of an output waveform when the state of the substrate W is diagnosed. A graph of a lower side of FIG. 7 shows a measured waveform ($V_{out}$) measured this time. The measured waveform ($V_{out}$) has four shape patterns (P1, P2, P3, and P4) corresponding to the four substrates W accommodated in the FOUP 6. A graph of an upper side of FIG. 7 shows a reference waveform ($V_{ref}$) for comparison measured last time. The reference waveform ($V_{ref}$) for comparison also has four shape patterns (P1', P2', P3', and P4') corresponding to the four substrates W accommodated in the FOUP 6. Note that the measured waveform and the reference waveform are stored in the storage unit of the control device 5 and are read out at the time of diagnosis.

First, the control device 5 compares the shape patterns (P1, P2, P3, and P4) of the measured waveform measured this time with the shape patterns (P1', P2', P3', and P4') of the reference waveform for comparison measured last time.

Next, the control device 5 determines whether or not a shape pattern in one section of the measured waveform ($V_{out}$) measured this time coincides with a shape pattern in one section of the reference waveform ($V_{ref}$) for comparison. Here, the shape pattern P3 in a third slot from the bottom of the FOUP 6 in the measured waveform ($V_{out}$) measured this time does not coincide with the shape pattern P3' in a third slot from the bottom of the FOUP 6 in the reference waveform ($V_{ref}$) for comparison measured last time. When the shape pattern P3 of the measured waveform ($V_{out}$) is compared with the shape pattern P3' of the reference waveform ($V_{ref}$), a section in which an output value of the shape pattern P3 decreases is longer than a section in which the shape pattern P3' decreases (f of FIG. 7). The control device 5 can determine that the substrate W accommodated in the third slot from the bottom is accommodated in the FOUP 6 in an inclined state. A diagnosis result of an inclination of a surface of the substrate W is displayed on the monitor of the display device 40 (see FIG. 3).

Note that the control device 5 may determine the inclination of the substrate W only from the measured waveform ($V_{out}$) measured this time. In that case, the control device 5 compares a shape pattern in one section with a shape pattern in another section of the measured waveform ($V_{out}$). The control device 5 determines whether or not the shape pattern in the one section coincides with the shape pattern in the other section. Here, the shape pattern P3 in a third section from the bottom of the FOUP 6 among the four shape patterns (P1, P2, P3, and P4) does not coincide with the shape pattern P4 in another section (for example, a fourth section from the bottom) of the FOUP 6. The control device 5 can determine that the substrate W accommodated in the third slot from the bottom is accommodated in the FOUP 6 in an inclined state.

<Diagnosis of State of FOUP>

Figure 8:
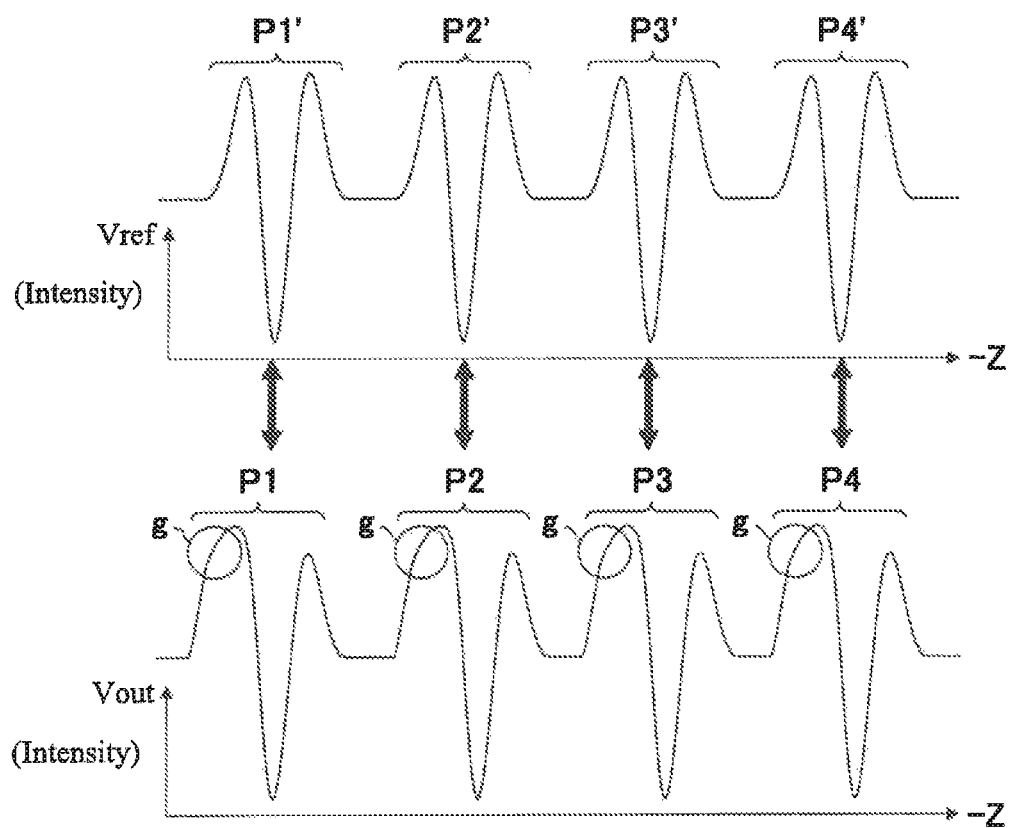
FIG. 8 is a graph showing an example of an output waveform at the time of the operation of the end effector.

The diagnosis of the state of the FOUP 6 is performed, for example, prior to the transfer operation of the substrate W. FIG. 8 is a graph showing an example of an output waveform when the state of the FOUP 6 is diagnosed. A graph of a lower side of FIG. 8 shows a measured waveform ($V_{out}$) measured this time. The measured waveform ($V_{out}$) has four shape patterns (P1, P2, P3, and P4) corresponding to the four substrates W accommodated in the FOUP 6. A graph of an upper side of FIG. 8 shows a reference waveform ($V_{ref}$) for comparison measured last time. The reference waveform ($V_{ref}$) for comparison also has four shape patterns (P1', P2', P3', and P4') corresponding to the four substrates W accommodated in the FOUP 6. Note that the measured waveform and the reference waveform are stored in the storage unit of the control device 5 and are read out at the time of diagnosis.

First, the control device 5 compares the shape patterns (P1, P2, P3, and P4) of the measured waveform measured this time with the shape patterns (P1', P2', P3', and P4') of the reference waveform for comparison. Next, the control device 5 determines whether or not shape patterns in all the sections of the measured waveform ($V_{out}$) measured this time coincide with shape patterns in all the sections of the reference waveform ($V_{ref}$) for comparison measured last time. Here, the shape patterns (P1, P2, P3, and P4) in all the sections of the measured waveform ($V_{out}$) measured this time do not coincide with the shape patterns (P1', P2', P3', and P4') in all the sections of the reference waveform ($V_{ref}$) for comparison measured last time. When the shape patterns (P1, P2, P3, and P4) in all the sections of the measured waveform ($V_{out}$) are compared with the shape patterns (P1', P2', P3', and P4') in all the sections of the reference waveform ($V_{ref}$) for comparison, all the sections in which output values of the shape patterns (P1, P2, P3, and P4) of the measured waveform ($V_{out}$) increase are longer than all the sections in which the shape patterns (P1', P2', P3', and P4') of the reference waveform ($V_{ref}$) for comparison increase (g of FIG. 8). The control device 5 can determine that the FOUP 6 is inclined. A diagnosis result of an inclination of the FOUP 6 is displayed on the monitor of the display device 40 (see FIG. 3).

Note that the measured waveform measured last time has been used as the reference waveform ($V_{ref}$) for comparison in the present embodiment, but a waveform measured in an ideal state where there is no inclination of the substrate W or the like may be used as the reference waveform. In addition, the reference waveform is not limited to the waveform measured in the ideal state, and a user may select any waveform as the reference waveform. In addition, a waveform measured by one apparatus may be used as the reference waveform in another apparatus.

Second Embodiment

Figure 9:
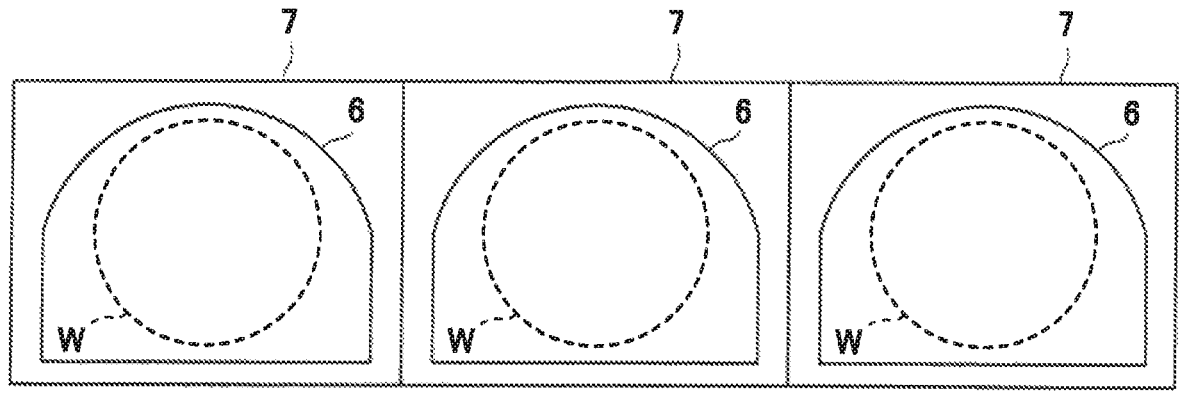
FIG. 9 is a plan view showing a substrate transfer apparatus according to a second embodiment of the present invention.
Figure 9:
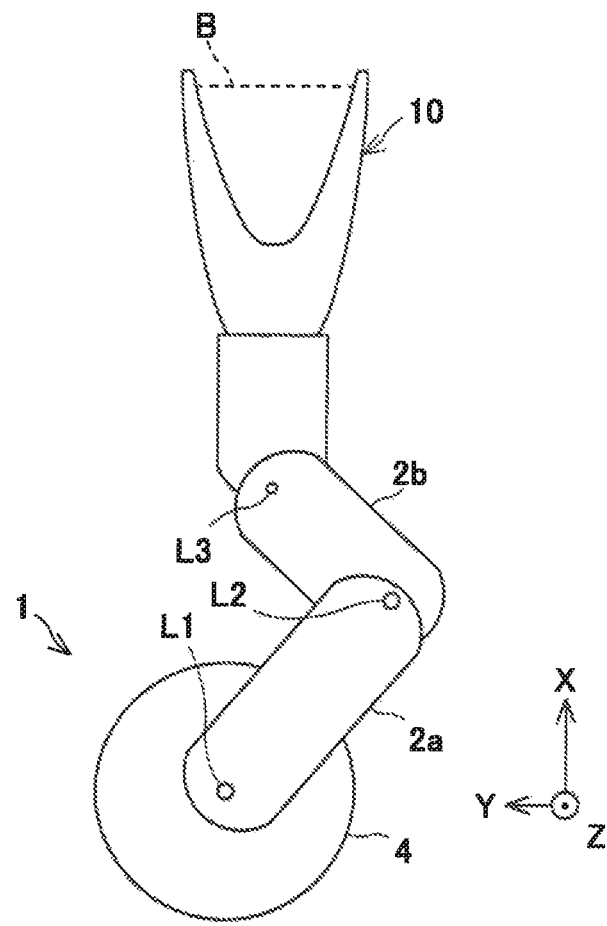

A substrate transfer apparatus 1 according to a second embodiment of the present invention will be described. A configuration of the substrate transfer apparatus 1 according to the present embodiment is similar to that of the substrate transfer apparatus according to the first embodiment, but is different from that of the substrate transfer apparatus according to the first embodiment in that a state of one FOUP 6 is diagnosed using shape patterns of measured waveforms measured in a plurality of FOUPs 6. FIG. 9 is a plan view showing the substrate transfer apparatus 1 according to the second embodiment of the present invention. As shown in FIG. 9, in the present embodiment, three FOUPs 6 are arranged in front of the substrate transfer apparatus 1. Here, respective bases 7 are arranged along a Y direction of FIG. 9.

Figure 10:
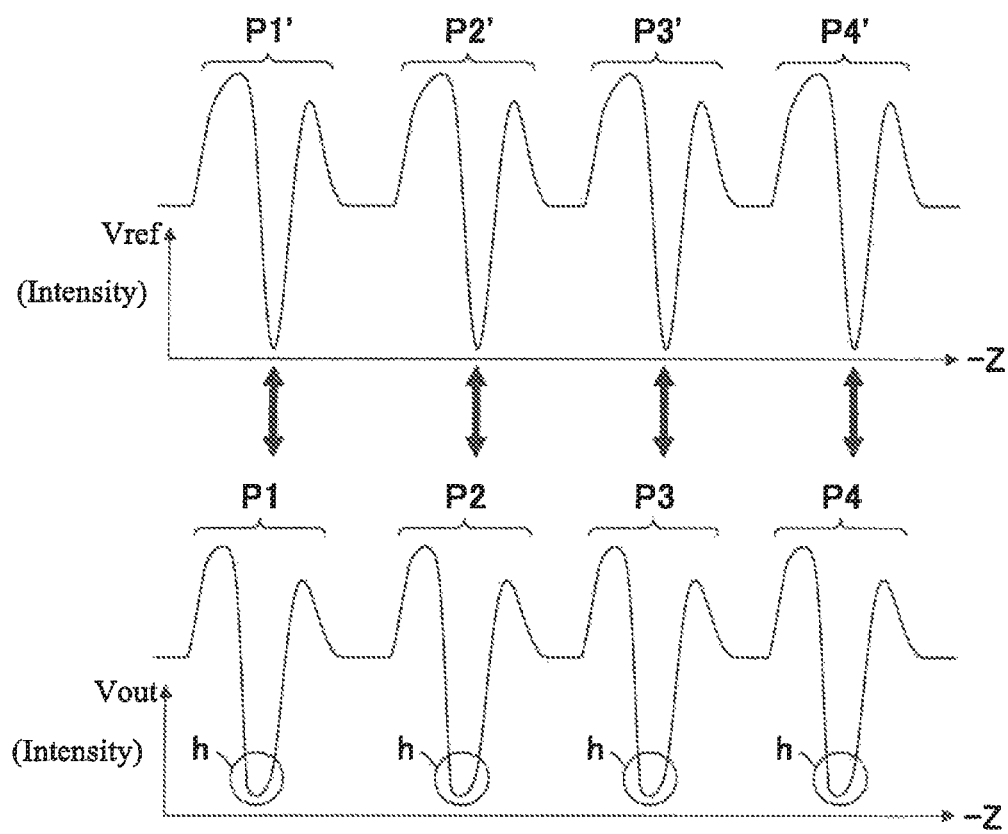
FIG. 10 is a graph showing an example of an output waveform at the time of an operation of an end effector.

In the present embodiment, a control device 5 diagnoses a state of one FOUP 6 using shape patterns of measured waveforms measured in the three FOUPs 6. FIG. 10 is a graph showing an example of an output waveform when the state of one FOUP 6 is diagnosed. A graph of a lower side of FIG. 10 shows a measured waveform ($V_{out}$) measured this time in an FOUP 6 of the center. The measured waveform ($V_{out}$) has four shape patterns (P1, P2, P3, and P4) corresponding to the four substrates W accommodated in the FOUP 6. A graph of an upper side of FIG. 10 shows a reference waveform ($V_{ref}$) for comparison measured this time in FOUPs 6 of both sides. The reference waveform ($V_{ref}$) for comparison also has four shape patterns (P1', P2', P3', and P4') corresponding to the four substrates W accommodated in the FOUP 6. Note that it is assumed that the waveforms measured this time in the FOUPs 6 of both sides are the same as each other, and here, only one measured waveform is shown as the reference waveform ($V_{ref}$). Note that the measured waveform and the reference waveform are stored in the storage unit of the control device 5 and are read out at the time of diagnosis.

The control device 5 compares shape patterns of a measured waveform measured in one FOUP 6 with shape patterns of a reference waveform for comparison measured in the other FOUPs 6. The control device 5 determines whether or not the shape patterns (P1, P2, P3, and P4) in all the sections of the measured waveform ($V_{out}$) measured in the FOUP 6 of the center coincide with the shape patterns (P1', P2', P3', and P4') in all the sections of the reference waveform ($V_{ref}$) for comparison measured in the other FOUPs. Here, the shape patterns (P1, P2, P3, and P4) in all the sections of the measured waveform ($V_{out}$) measured this time in the FOUP 6 of the center do not coincide with the shape patterns (P1', P2', P3', and P4') in all the sections of the reference waveform ($V_{ref}$) for comparison measured in the other FOUPs. When the shape patterns (P1, P2, P3, and P4) in all the sections of the measured waveform ($V_{out}$) are compared with the shape patterns (P1', P2', P3', and P4') in all the sections of the reference waveform ($V_{ref}$) for comparison, all the sections in which output values of the shape patterns (P1, P2, P3, and P4) of the measured waveform ($V_{out}$) decrease are longer than all the sections in which the shape patterns (P1', P2', P3', and P4') of the reference waveform ($V_{ref}$) for comparison decrease (h of FIG. 10). The control device 5 can determine that the FOUP 6 of the center is inclined. A diagnosis result of an inclination of the FOUP 6 is displayed on the monitor of the display device 40 (see FIG. 3). In the present embodiment, the control device 5 can diagnose the state of one FOUP 6 using the shape patterns of the measured waveforms measured in the plurality of FOUPs 6.

Note that, in the present embodiment, the measured waveform in one FOUP 6 in the substrate transfer apparatus is compared with the reference waveform measured in the other FOUPs 6, but may also be compared with a reference waveform measured in an ideal state.

Other Embodiments

Note that a case where it is determined whether or not the reference waveform and the measured waveform (the numbers of peaks) coincide with each other has been described as a comparing method in the first embodiment, but, for example, the reference waveform may be set to have a single shape pattern (for example, only P1' of FIG. 7) and the single shape pattern may be repeatedly compared with all the shape patterns of the measured waveforms (for example, P1 to P4 of FIG. 7).

In addition, a reference waveform prepared based on a value stored in the storage unit in advance as a Z position where the substrate W is present may be compared with the measured waveform.

Note that various methods can be used as a method of comparing the shape patterns of the measured waveform with the shape patterns of the reference waveform for comparison.

(a) For example, it may be determined how much two waveforms deviate from each other. Examples of a method of calculating how much the two waveforms deviate from each other can include a method of calculating how much the two waveforms deviate from each other based on a deviation at one or a plurality of Z positions and a method of calculating how much the two waveforms deviate from each other based on a deviation between integrated values of the two waveforms in one or a plurality of sections at a Z position.

(b) Peak values of the two waveforms may be compared with each other. For example, maximum values or minimum values of $V_{ref}$ for one shape pattern (for example, P1' and P1 of FIG. 7) of each of the two waveforms may be compared with each other. Alternatively, left and right peak values sandwiching valley (portion of h in FIG. 10) of $V_{ref}$ may be compared with each other.

Figure 11:
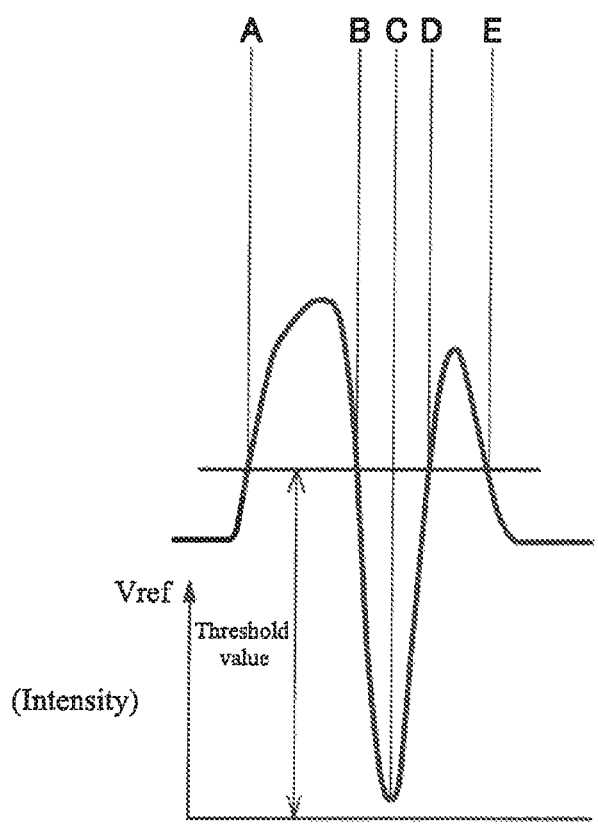
FIG. 11 is a view for describing a comparing method of a measured waveform.

(c) The comparison may be performed using values (A, B, D, and E of a waveform of FIG. 11) on a horizontal axis, the values coinciding with threshold values of the two waveforms. An interval between A and B of FIG. 11 may be compared. An interval between D and E of FIG. 11 may be compared. An interval between a valley (corresponding to C of a lower drawing) of $V_{ref}$ of FIG. 11 and A, B, D, or E may be compared.

Note that the control device 5 diagnoses the inclination of the substrate W and the inclination of the FOUP 6 in each of the above embodiments, but may also diagnose a state of the end effector 10. The diagnosis of the state of the end effector 10 is performed, for example, after the processing is temporarily suspended in the semiconductor processing facility due to collision of the robot with the surrounding environment caused by an erroneous operation of an operator for the robot and before an operation of the robot (substrate transfer apparatus 1) is restarted. The diagnosis of the state of the end effector 10 is performed in a state where the inclination of the FOUP 6 is corrected. The control device 5 compares the shape patterns of the measured waveform measured this time with the shape patterns of the reference waveform for comparison measured last time in the state where the inclination of the FOUP 6 is corrected. In a case where the shape patterns in all the sections of the measured waveform measured this time do not coincide with the shape patterns in all the sections of the reference waveform for comparison measured last time, it is possible to determine that the end effector 10 is inclined.

In addition, the control device 5 may diagnose a lifetime of an optical component. The control device 5 can compare the shape patterns of the measured waveform measured this time with the shape patterns of the reference waveform for comparison measured last time, and determine that at least one of intensity of light of the light emitting element 16 (see FIG. 3) of the light emitting unit 13 and light receiving sensitivity of the light receiving element 18 (see FIG. 3) decreases in a case where output values in all the sections of the measured waveform measured this time are lower than output values in all the sections of the reference waveform for comparison measured last time.

Note that the light receiving element 18 outputs the voltage value continuously changed depending on the amount of received light in the present embodiment, but may also output a current value continuously changed depending on the amount of received light.

Third Embodiment

Figure 12:
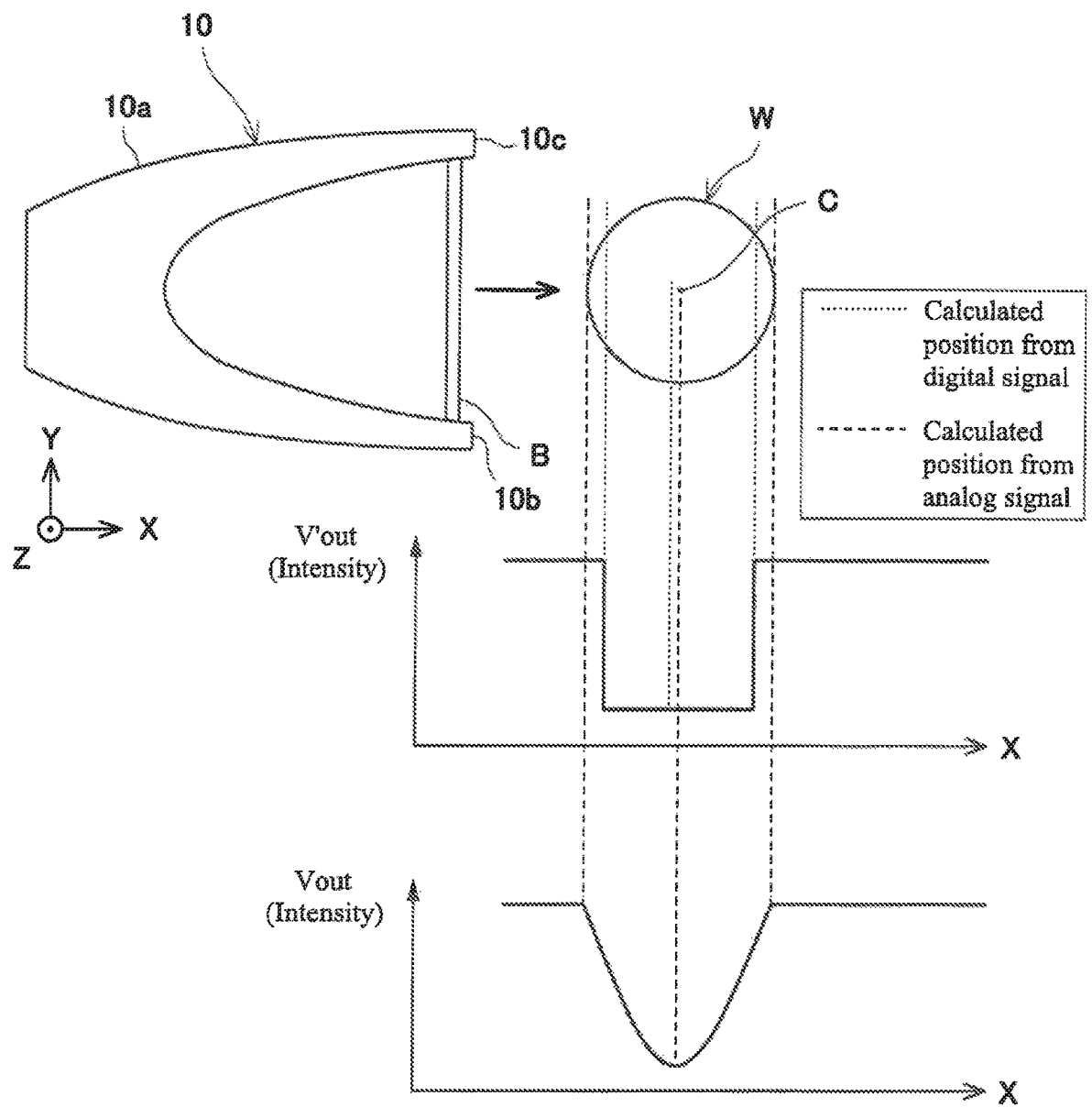
FIG. 12 is a graph showing an example of an output waveform at the time of an operation of an end effector in a substrate transfer apparatus according to a third embodiment of the present invention.

A substrate transfer apparatus according to a third embodiment of the present invention will be described. A basic configuration of the substrate transfer apparatus according to the present embodiment is similar to that of the above embodiment (FIGS. 1 to 3), and a description thereof will thus be omitted. An upper part of FIG. 12 shows a plan view of an end effector 10 in the substrate transfer apparatus according to the present embodiment. A target is a substrate W having a disk shape. Here, for simplicity, only the end effector 10 and the substrate W are shown. The substrate W is accommodated in, for example, a slot of an FOUP 6 (see FIG. 4(a)). The end effector 10 and the substrate W are adjusted to the same level (reference position in a Z-axis direction of FIG. 12). The present embodiment is different from the above embodiment in that a control device 5 controls an operation of an arm 2 to cause light B traveling through a tip of the end effector 10 to scan a substrate W having a circular shape in a horizontal direction (a positive direction of an X axis of FIG. 12) with respect to the substrate W in plan view and in that the control device 5 measures a position of the substrate W in the horizontal direction based on a measured waveform of an output value continuously changed in a light receiving unit 14 according to a relative positional relationship between the light B and the substrate W during the operation of the arm 2.

A graph of FIG. 12 shows an output waveform at the time of an operation of the end effector 10. A horizontal axis indicates a positive direction of X, and a vertical axis indicates a measured waveform output from the light receiving unit 14 of the end effector 10 according to an amount of received light (intensity of light). A lower graph of FIG. 12 shows a measured waveform (analog signal) of an output voltage $V_{out}$ continuously changed in the light receiving unit 14 according to the relative positional relationship between the light B and the substrate W during the operation of the arm 2. An upper graph of FIG. 12 shows a measured waveform (digital signal) converted into a binary signal $V'_{out}$ by setting a threshold value for the analog signal (output voltage $V_{out}$) shown in the lower graph.

In a current mapping sensor, a value of the binary signal $V'_{out}$ (the upper graph of FIG. 12) is changed depending on whether or not the light B of the end effector 10 is shielded by the substrate W. Thus, the presence or absence of the substrate W is detected. Here, as a comparative example, a method of measuring the position of the substrate W in the horizontal direction using the digital signal ($V'_{out}$) of the current mapping sensor will be described. Specifically, when the light B of the end effector 10 is moved in the horizontal direction (the positive direction of the X axis of FIG. 12) with respect to the substrate W, the light B of the end effector 10 is shielded by a side surface (a surface parallel to a Z axis of FIG. 12) of the substrate W. Immediately after the light B of the end effector 10 reaches an edge (a left edge of FIG. 12) of the substrate W, an amount of received light (intensity of light) in the light receiving unit 14 starts to decrease. As a result, when the amount of received light (the intensity of light) becomes smaller than a set threshold value, the digital signal ($V'_{out}$) is changed from a high level to a low level. By calculating a position (a value in the positive direction of the X axis) where the digital signal ($V'_{out}$) is changed from the high level to the low level, it is possible to measure a position of the edge (the left edge of FIG. 12) of the substrate W. However, as indicated by a dotted line in FIG. 12, the position of the edge of the substrate W measured by the comparative example deviates from an actual position of the edge of the substrate W.

Thereafter, when the light B of the end effector 10 further moves in the horizontal direction (the positive direction of the X axis of FIG. 12), the amount of received light (the intensity of light) in the light receiving unit 14 further decreases. After the light B of the end effector 10 further moves in the horizontal direction to pass near a center position C of the substrate W, the amount of received light (the intensity of light) in the light receiving unit 14 gradually increases. During this time, the digital signal ($V'_{out}$) remains at the low level. Thereafter, when the amount of received light (the intensity of light) in the light receiving unit 14 exceeds a set threshold value, the digital signal ($V'_{out}$) is changed from the low level to the high level. By calculating a position (a value in the positive direction of the X axis) where the digital signal ($V'_{out}$) is changed from the low level to the high level, it is possible to measure a position of an edge (a right edge of FIG. 12) of the substrate W. However, as indicated by a dotted line in FIG. 12, the position of the edge of the substrate W measured by the comparative example deviates from an actual position of the edge of the substrate W.

In addition, by calculating a distance between the position (the value in the positive direction of the X axis) where the digital signal ($V'_{out}$) is changed from the high level to the low level and the position (the value in the positive direction of the X axis) where the digital signal ($V'_{out}$) is changed from the low level to the high level, it is possible to measure a center position of the substrate W. However, as indicated by a dotted line in FIG. 12, the center position of the substrate W measured by the comparative example deviates from an actual center position C of the substrate W.

As described above, in the comparative example, in a case where the position of the substrate W in the horizontal direction is measured by the digital signal ($V'_{out}$) of the current mapping sensor, the high level and the low level of the digital signal ($V'_{out}$) deviate from an actual position of the substrate W due to setting of a threshold value or hysteresis of an optical sensor, such that the position of the substrate W in the horizontal direction cannot be accurately measured.

On the other hand, in the present embodiment, the position of the substrate W in the horizontal direction is measured by the analog signal $V_{out}$ continuously changed in the light receiving unit 14. Specifically, when the light B of the end effector 10 is moved in the horizontal direction (the positive direction of the X axis of FIG. 12) with respect to the substrate W, the light B of the end effector 10 is shielded by the side surface (the surface parallel to the Z axis of FIG. 12) of the substrate W. Immediately after the light B of the end effector 10 reaches the edge (the left edge of FIG. 12) of the substrate W, the amount of received light (the intensity of light) in the light receiving unit 14 starts to decrease. As a result, the analog signal ($V_{out}$) starts to decrease from a maximum value. By calculating a position (a value in the positive direction of the X axis) where the analog signal ($V_{out}$) starts to decrease from the maximum value, it is possible to measure position of the edge (the left edge of FIG. 12) of the substrate W. The measured position of the edge of the substrate W is closer to the actual position of the edge of the substrate W as compared with the comparative example, as indicated by a broken line in FIG. 12.

Thereafter, when the light B of the end effector 10 further moves in the horizontal direction (the positive direction of the X axis of FIG. 12), the amount of received light (the intensity of light) in the light receiving unit 14 gradually decreases. As a result, the analog signal ($V_{out}$) gradually decreases from the maximum value. When the light B of the end effector 10 further moves in the horizontal direction to pass near the center position C of the substrate W, the analog signal ($V_{out}$) becomes a minimum value. By calculating a position (a value in the positive direction of the X axis) where the analog signal ($V_{out}$) reaches the minimum value, it is possible to measure the center position of the substrate W. The measured center position of the substrate W is closer to the actual center position C of the substrate W as compared with the comparative example (line indicated by a broken line of FIG. 12).

Thereafter, when the light B of the end effector 10 further moves in the horizontal direction (the positive direction of the X axis of FIG. 12), the amount of received light (the intensity of light) in the light receiving unit 14 gradually increases. As a result, the analog signal ($V_{out}$) gradually increases. When the light B of the end effector 10 passes through the edge (the right edge of FIG. 12) of the substrate W, the light B of the end effector 10 is not shielded by the substrate W, and the analog signal ($V_{out}$) thus reaches the maximum value again. By calculating a position (a value in the positive direction of the X axis) where the analog signal ($V_{out}$) reaches the maximum value, it is possible to measure position of the edge (the right edge of FIG. 12) of the substrate W. The measured position of the edge of the substrate W is closer to the actual position of the edge of the substrate W as compared with the comparative example, as indicated by a broken line in FIG. 12.

According to the present embodiment, it is possible to measure the position of the substrate W in the horizontal direction with higher accuracy as compared with a conventional method (comparative example) based on the measured waveform of the analog signal $V_{out}$ continuously changed according to the amount of received light in the light receiving unit 14.

Note that in the present embodiment, the substrate W accommodated in the FOUP and having the disk shape is used as the target and the position of the substrate W in the horizontal direction is measured, but the present invention is not limited thereto. For example, the target may be an object having a rod shape.

From the above description, many modifications or other embodiments of the present invention are obvious to those skilled in the art. Therefore, the above description should be construed as illustrative only and is provided in order to teach the best mode of carrying out the present invention to those skilled in the art. Details of structures and/or functions of the present invention can be substantially changed without departing from the spirit of the present invention.

The invention claimed is:
1. A substrate transfer apparatus comprising:
a base;
a robot arm mounted on the base;
an end effector provided at a tip of the robot arm and having a first tip portion and a second tip portion that are bifurcated;
a light emitting unit configured to emit light from the first tip portion toward the second tip portion;
a light receiving unit configured to convert detection light into an output value continuously changed depending on an amount of received light traveling through a space between the first tip portion and the second tip portion and incident on the second tip portion; and
a control device controlling an operation of the robot arm, wherein the control device
controls an operation of the robot arm so that light traveling through a tip of the end effector scans edges of a plurality of substrates accommodated in a front opening unified pod (FOUP), and
compares shape patterns of a measured waveform of the output value continuously changed in the light receiving unit with shape patterns of a reference waveform for comparison according to a relative positional relationship between the light and the substrate during the operation of the robot arm and diagnoses at least one of a state of the substrate, a state of the FOUP, and a state of the end effector based on a comparison result.

2. The substrate transfer apparatus according to claim 1, wherein the control device compares a shape pattern in one section with a shape pattern in another section of the measured waveform, and determines that a surface of the substrate is inclined in the one section in a case where the shape pattern in the one section does not coincide with the shape pattern in the other section.

3. The substrate transfer apparatus according to claim 1, wherein the control device
compares shape patterns of a measured waveform measured this time with shape patterns of a measured waveform for comparison measured last time, and
determines that a surface of the substrate is inclined in one section of the measured waveform measured this time in a case where a shape pattern in the one section of the measured waveform measured this time does not coincide with a shape pattern in one section of the measured waveform for comparison measured last time.

4. The substrate transfer apparatus according to claim 1, wherein the control device
compares the shape patterns of the measured waveform measured this time with the shape patterns of the measured waveform for comparison measured last time, and
determines that the FOUP is inclined in a case where shape patterns in all sections of the measured waveform do not coincide with shape patterns in all sections of the measured waveform for comparison.

5. The substrate transfer apparatus according to claim 1, wherein a plurality of the FOUPs are arranged at different positions, and
the control device
compares shape patterns of a measured waveform measured in one FOUP with shape patterns of a measured waveform for comparison measured in the other FOUPs, and
determines that the one FOUP is inclined in a case where shape patterns in all sections of the measured waveform measured in the one FOUP do not coincide with shape patterns in all sections of the measured waveform for comparison measured in the other FOUPs.

6. The substrate transfer apparatus according to claim 4, wherein the control device compares the shape patterns of the measured waveform measured this time with the shape patterns of the measured waveform for comparison measured last time in a state where an inclination of the FOUP is corrected, and determines that the end effector is inclined in a case where shape patterns in all sections of the measured waveform measured this time do not coincide with shape patterns in all sections of the measured waveform for comparison measured last time.

7. The substrate transfer apparatus according to claim 1, wherein the control device compares the shape patterns of the measured waveform measured this time with the shape patterns of the measured waveform for comparison measured last time, and determines that at least one of intensity of light of the light emitting unit and light receiving sensitivity of the light receiving unit decreases in a case where output values in all the sections of the measured waveform measured this time are lower than output values in all the sections of the measured waveform for comparison measured last time.

8. The substrate transfer apparatus according to claim 1, further comprising a display device displaying a diagnosis result.

9. A substrate transfer apparatus comprising:

a base;

a robot arm mounted on the base;

an end effector provided at a tip of the robot arm and having a first tip portion and a second tip portion that are bifurcated;

a light emitting unit configured to emit light from the first tip portion toward the second tip portion;

a light receiving unit configured to convert detection light into an output value continuously changed depending on an amount of received light traveling through a space between the first tip portion and the second tip portion and incident on the second tip portion; and a control device controlling an operation of the robot arm, wherein the control device controls the operation of the robot arm so that light traveling through a tip of the end effector scans a target in a horizontal direction with respect to the target and measures a position of the target in the horizontal direction based on a measured waveform of the output value continuously changed in the light receiving unit according to a relative positional relationship between the light and the target during the operation of the robot arm.

10. The substrate transfer apparatus according to claim 9, wherein the position of the target is a position of a center or a position of an edge of the target in a horizontal direction.

11. The substrate transfer apparatus according to claim 9, wherein the target is a substrate accommodated in an FOUP and having a disk shape.

\* \* \* \* \*